United States Patent
Krauter et al.

(10) Patent No.: US 6,510,540 B1
(45) Date of Patent: Jan. 21, 2003

(54) WINDOWING MECHANISM FOR REDUCING PESSIMISM IN CROSS-TALK ANALYSIS OF DIGITAL CHIPS

(75) Inventors: Byron Lee Krauter, Austin, TX (US); Sharad Mehrotra, Austin, TX (US); Jonathan Humphrey Saxman, Round Rock, TX (US); Paul Gerard Villarrubia, Round Rock, TX (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 09/640,540

(22) Filed: Aug. 17, 2000

(51) Int. Cl.[7] .............................................. G06F 17/50
(52) U.S. Cl. ...................... 716/4; 716/5; 716/6; 716/18
(58) Field of Search .............................. 716/6, 7, 8, 18, 716/1–5; 703/13–15, 19

(56) References Cited

U.S. PATENT DOCUMENTS

| | | | | |
|---|---|---|---|---|
| 4,135,161 A | * | 1/1979 | Torrieri | 327/1 |
| 5,555,506 A | * | 9/1996 | Petschauer et al. | 703/13 |
| 5,568,395 A | * | 10/1996 | Huang | 703/13 |
| 5,983,006 A | * | 11/1999 | Carlson et al. | 716/4 |
| 6,128,769 A | * | 10/2000 | Carlson et al. | 703/19 |

\* cited by examiner

Primary Examiner—Matthew Smith
Assistant Examiner—Paul Dinh
(74) Attorney, Agent, or Firm—Duke W. Yee; Robert M. Carwell; Michael R. Nichols

(57) ABSTRACT

This invention reduces pessimism in cross talk analysis of digital circuits by combining only the peak noises from aggressor nets that can switch simultaneously during the time interval when the downstream receiving latch can sample the errant data. This is done by, first, determining aggressor switching windows and victim sensitivity windows. These windows are then used to determine which combination of noise sources can temporally align so as to cause the greatest noise within the victim sensitivity window.

28 Claims, 6 Drawing Sheets

US 6,510,540 B1

WINDOWING MECHANISM FOR REDUCING PESSIMISM IN CROSS-TALK ANALYSIS OF DIGITAL CHIPS

BACKGROUND OF THE INVENTION

1. Technical Field

The present invention relates generally to a signal processing system and in particular to an improved method for performing cross-talk analysis. Still, more particularly, the present invention discloses a novel method to reduce pessimism in cross-talk analysis of digital chips.

2. Description of Related Art

In digital chips, excessive cross-talk noise on a victim net can lead to logic failure. A victim net as depicted in the prior art, may be a simple, point-to-point circuit comprised of a source and a sink, or it may be a more complex circuit. When sufficient cross-talk noise is injected onto a net, its logic state will change and any "down-stream" logic circuits will then sense the errant logic state. If at some point downstream the corrupted logic state is sampled (or clocked) into a latch, then the logic state of the digital circuit is incorrect and the circuit has failed. It is therefore desirable to be able to simulate such phenomena and correct the circuit design prior to the time and cost of actually manufacturing the circuit. The common approach for determining potential cross-talk-induced failures is to first simulate the peak noise induced at the victim sink pin by each of the neighboring aggressor nets. Because the exact times at which these noises occur cannot be precisely determined, the common approach is to combine the noise of each aggressor net as if these peaks were temporally aligned. And finally, if this worst case combination exceeds the noise tolerance of the sink pin, the common approach tags the net as a failing net. This procedure is clearly pessimistic because in many cases, not all aggressor nets can switch simultaneously nor does the maximum noise occur when the downstream latch samples the net. An aggressor net as depicted in the prior art, may be a simple, point-to-point circuit comprised of a source and a sink, or it may be a more complex circuit. Pessimism in cross talk analysis of digital circuits is the result of determining that the worst-case noise is the combination of the peak noise from all possible noise sources, i.e. any potential aggressor nets. Therefore, it would be advantageous to have an improved method and apparatus for reducing pessimism in simulating circuits.

SUMMARY OF THE INVENTION

The present invention reduces pessimism in a victim net by combining only the peak noises from aggressor nets that can switch simultaneously during the time interval when the downstream receiving latch can sample the errant data. First, victim sensitivity windows and aggressor switching windows are determined using results from timing analysis and circuit simulation of coupled-interconnect noise.

The aggressor switching window (ASW) is a continuous time interval that repeats every cycle of the aggressor clock (CLK A). This time interval is the interval when the peak noise created by the aggressor can develop at the victim sink.

The victim sensitivity window (VSW) is a continuous time interval that repeats every cycle of the victim clock (CLK V). This time interval is the time when the downstream errant data can cause the receiving latch to sample incorrectly.

Once aggressor switching windows and the victim sensitivity window are found, further timing analysis is performed to determine whether any overlap between the various aggressor switching windows and the victim sensitivity window exists. The overlap of the timing windows will be the basis for restricting which aggressor circuits contribute to the total noise. Specifically, if the timing windows of two aggressor nets do not overlap, they will be considered as never both contributing to the total noise. Likewise, if an aggressor timing window does not overlap a victim sensitivity window, it will be considered to never contribute to the total noise. The total noise will then be determined as the worst possible noise resulting from all possible combinations of aggressor circuits whose timing windows meet the overlap criteria.

The technique employed in determining maximum noise effectuates a reduction in pessimism. If a given aggressor net has a corresponding aggressor switching window that does not occur within a given victim sensitivity window, its peak noise will not be considered in circuit failure analysis, thereby reducing the number of false fails for a circuit design. Pessimism may be reduced in synchronous as well as asynchronous circuits using the techniques disclosed in this invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
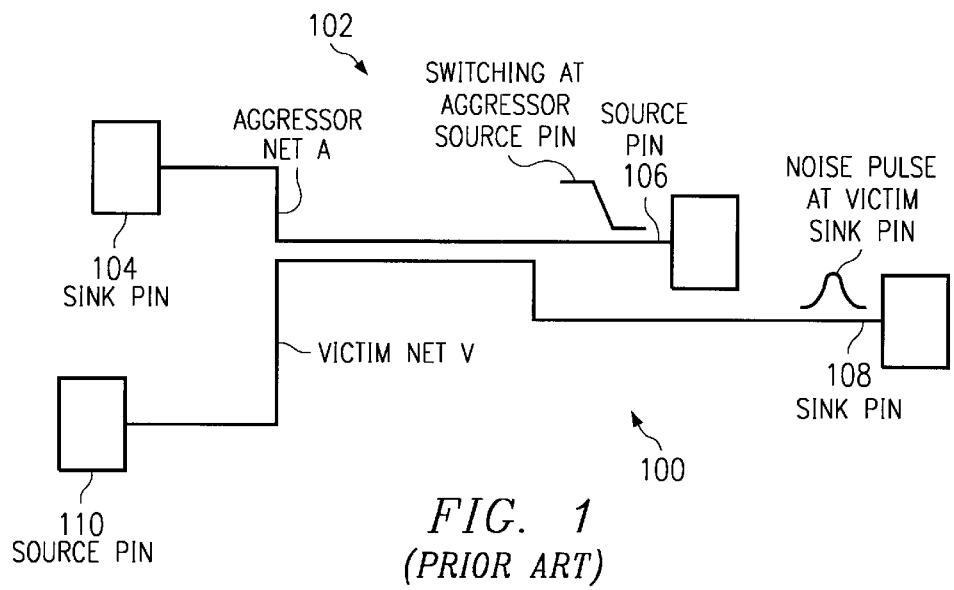
FIG. 1 is an example of a configuration of aggressor and victim nets.

With reference now to the figures, FIG. 1, depicts a victim net 100 and a single aggressor net 102. This basic description of the networks involved is utilized only to aid in describing the invention. The circuits involved in these timing analyses could be more complex. There may also be more than one aggressor net. Aggressor Net 102 is a point to point network having a sink pin 104, a source pin 106, and a clock signal, CLK A. Victim net 100 is also a point to point network having a sink pin 108, a source pin 110, and a clock signal, CLK V. The receiving circuit on the victim net is either a latch clocked at a frequency Fv or a circuit that creates a digital signal that is eventually sampled by a latch clocked at frequency Fv. The sending circuit on the aggressor net transmits digital signals at a frequency Fa. The cycle times of CLK V and CLK A will be denoted as Tv and Ta, respectively.

Figure 2:
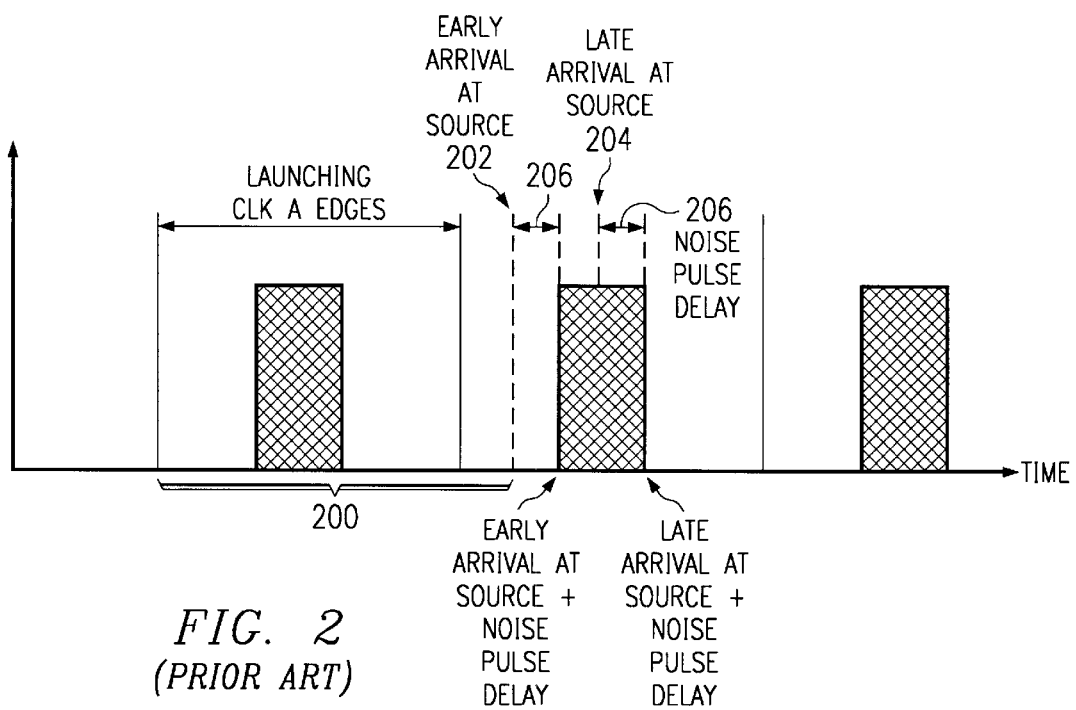
FIG. 2 is a visual representation of the aggressor switching window.

FIG. 2 is a visual representation of the method used to obtain an aggressor circuit switching window. The aggressor switching window is a continuous time interval that repeats every cycle of the aggressor clock, CLK A, as shown in section 200. This time interval is the interval when the peak noise created by the aggressor can develop at the victim sink. The aggressor switching window occurs after a launching CLK A edge. This window is defined by a beginning point calculated by adding the early arrival time at the source to a noise pulse delay and an ending point that is calculated by adding the late arrival time at the source to the noise pulse delay. Noise pulse delay 206 is the time interval from when the aggressor switches and when the peak noise develops at the victim sink. These aggressor switching windows are then used to determine which combination of noise sources can temporally align so as to cause the greatest noise within the victim sensitivity window. Once it is determined which noise sources occur simultaneously within the victim sensitivity window as shown in FIG. 3, the quantity of noise used to determine whether or not a circuit will fail will be the combination of only those noise sources that occur simultaneously within the victim sensitivity window; not the worst case noise, which is determined by combining all the noise sources as if they would always occur simultaneously within any given interval.

Figure 3:
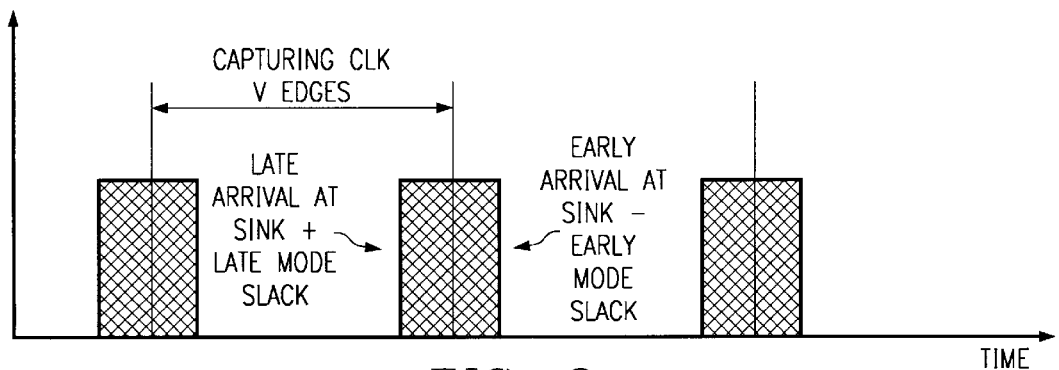
FIG. 3 is a visual representation of the victim sensitivity window in accordance with a preferred embodiment of the present invention.

The victim sensitivity window (VSW) in FIG. 3 is a continuous time interval that repeats every cycle of the victim clock, CLK V. This time interval is the period in which downstream errant data can cause the receiving latch to sample incorrectly. It is constructed from the early required arrival time (ERAT) and the late required arrival time (LRAT). LRAT (also known as the set-up time) is defined as victim sink late arrival time plus late mode slack in cycle n and ERAT (also known as the hold time) is defined as victim sink early arrival time minus early mode slack in cycle n+1. Early slack is the difference between the actual early arrival time and the earliest arrival time that still guarantees correct functional operation. Late slack is the difference between the latest arrival time that still guarantees correct functional operation and the actual late arrival time. In other words, early slack measures the hold time margin and late slack measures the set up margin. The beginning of the VSW is LRAT in cycle n while the end of the window is ERAT in cycle n+1.

Using the aggressor switching windows and victim sensitivity window defined above, one can determine which subset of aggressors can contribute to the peak noise when the victim net is sampled. If the subset is less than the total number of aggressors, pessimism in the cross-talk analysis will be reduced. That is, peak noise will be reduced.

It should be noted that while the early arrival time always precedes the late arrival time, static timing tools sometimes report early arrival times that are greater than the late arrival times. This apparent inconsistency simply means the timing tool has specified the early arrival time of the net relative to the next cycle of the clock. A simple cycle adjust, or subtracting one clock period from the early arrival time, returns the natural ordering between the early and late arrival times.

The following paragraphs describe the analysis of synchronous nets in accordance with a preferred embodiment of the present invention. That is the set of aggressor nets (A1, A2, ... An) and victim net (V) under consideration are all synchronous to one another. These nets may not share the same clock period but their clock periods (Ta1, Ta2, ... Tan, and Tv) are multiples of a common clock period. (For example, if two clocks have periods of 2 and 5, the common clock period would be 1, the greatest common divisor of 2 and 5.) This common clock period will be referred to as the gcd clock period.

For a given set of synchronous aggressor nets (A1, A2, ... An) and victim sink (V), the process begins by finding the least common multiple of their cycle times (i.e. Ta1, Ta2, ... Tan, and Tv). For example, if we had two aggressor nets with cycle times of 2 and 3 nanoseconds and a victim net of 4 nanoseconds, the least common multiple would be 12 nanoseconds. Next an arbitrary time period spanning this time interval is chosen. In the previous example, we could choose any window from t to t+12 nanoseconds where t is an arbitrary time. In the following discussion, this window is referred to as the "LCM cycle."

In this LCM cycle, the times when each aggressor net can induce noise can be formed as the union of all possible alignments of the aggressor switching window. Each such alignment consists of the aggressor switching window shifted by an integral number of its cycle times, both forward and backward, for all such cases where its switching window lies within the LCM cycle. Any portion of a window that extends outside the LCM cycle is discarded; that is, either the early time of the window is increased or the late time decreased so that the window is within the LCM cycle. Such is done for each aggressor. Such is also done for the victim sensitivity window per its cycle time. By doing this, all possible alignments of aggressor windows and the sink sensitivity window are represented within the LCM cycle.

The aggressor combination that generates the worst noise can now be determined by examining each unique set of overlapping aggressor switching windows and victim sensitivity window that occur in the LCM cycle.

Figure 4:
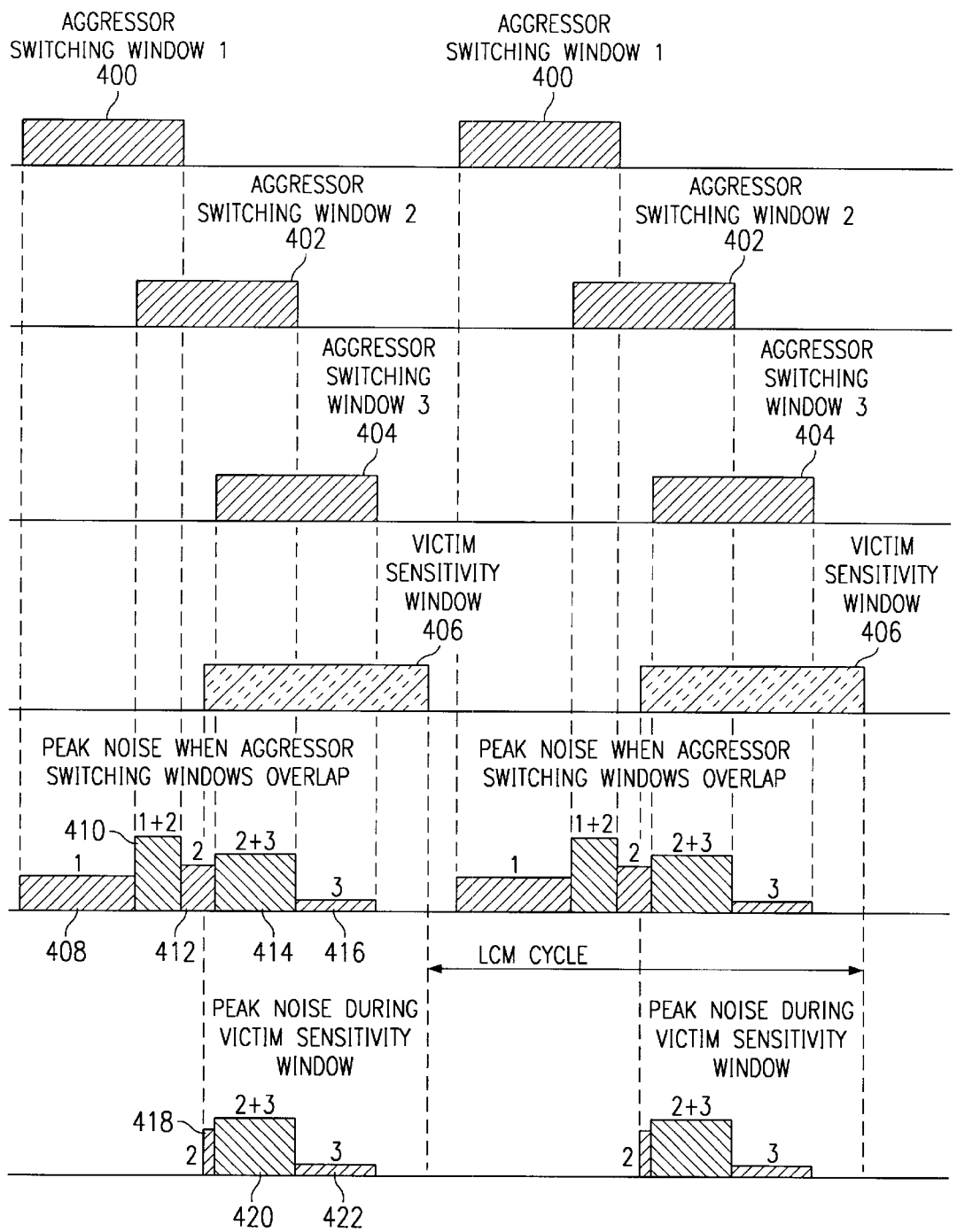
FIG. 4 is an example of how three aggressor switching windows and a victim sensitivity window might be analyzed in accordance with a preferred embodiment of the present invention.

FIG. 4 shows an example of how three aggressor switching windows and a victim sensitivity window may be analyzed to avoid combining the peak noises of all three aggressors in accordance with a preferred embodiment of the present invention. In this example, the aggressor switching windows (400, 402, 404) and the victim sensitivity window 406 repeat at the same clock frequency. In other words, CLK A1=CLK A2=CLK A3=CLK V and the LCM cycle=Ta1=Ta2=Ta3=Tv. Here, for clarity, the full aggressor switching windows and victim sensitivity window are shown even though the algorithmic procedure is to omit any such windows outside the LCM cycle and to adjust the window start or stop times of those which lie only partially within the LCM cycle.

In FIG. 4, the first 400 and third 404 aggressor switching windows never overlap. Therefore, these two aggressor switching windows never both contribute to the worst case noise. Furthermore, although the peak noise occurs when aggressor switching windows 1 and 2 temporally overlap 410, this noise is of no concern because the highest noise that occurs within the victim sensitivity window occurs when aggressor switching windows 2 and 3 temporally overlap 420.

Also note in FIG. 4 that, for this particular example, the LCM cycle can be defined so that all aggressor switching windows and the victim sensitivity window are continuous time intervals inside the LCM cycle. For example, the LCM cycle may be defined to start at the end of the victim sensitivity window in one cycle and end at the end of the victim sensitivity window in the next cycle. Using this definition, which is depicted at the bottom of FIG. 4, all of the aggressor switching windows and the victim sensitivity window are continuous time intervals inside the LCM window. This can be done as a convenience for computational purposes.

Figure 5:
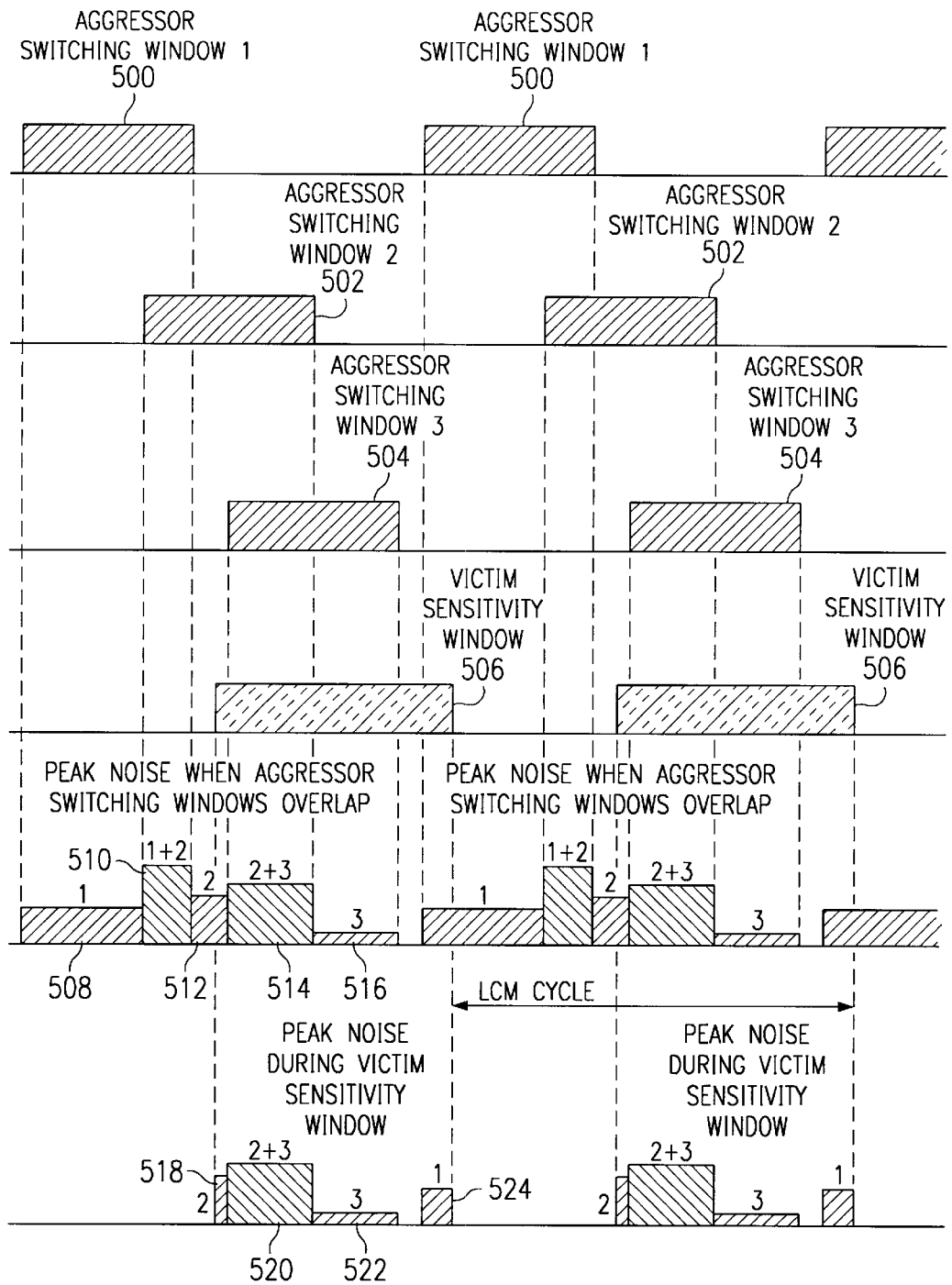
FIG. 5 depicts a case where some Aggressor Switching Windows overlap the LCM cycle edges in accordance with a preferred embodiment of the present invention.

FIG. 5, depicts a case in which some aggressor switching windows (500, 502) overlap the LCM cycle edges. This case is simply the example in FIG. 4 with the clock period shortened so that the definition of the LCM cycle must span two instances of at least one aggressor switching window or victim sensitivity window. For example, if the LCM cycle is again defined to start at the end of the victim sensitivity window in one clock cycle and extend to the end of the victim sensitivity window in the next clock cycle, this definition now spans two instances of aggressor switching window.

The example shown in FIG. 5 is a case of an aggressor switching window that overlaps the endpoints of the LCM cycle and is seen to be split an effectively viewed as two separate windows, one that equals the overlap at the beginning of the LCM cycle and another that equals the overlap at the end of the LCM window.

Figure 6:
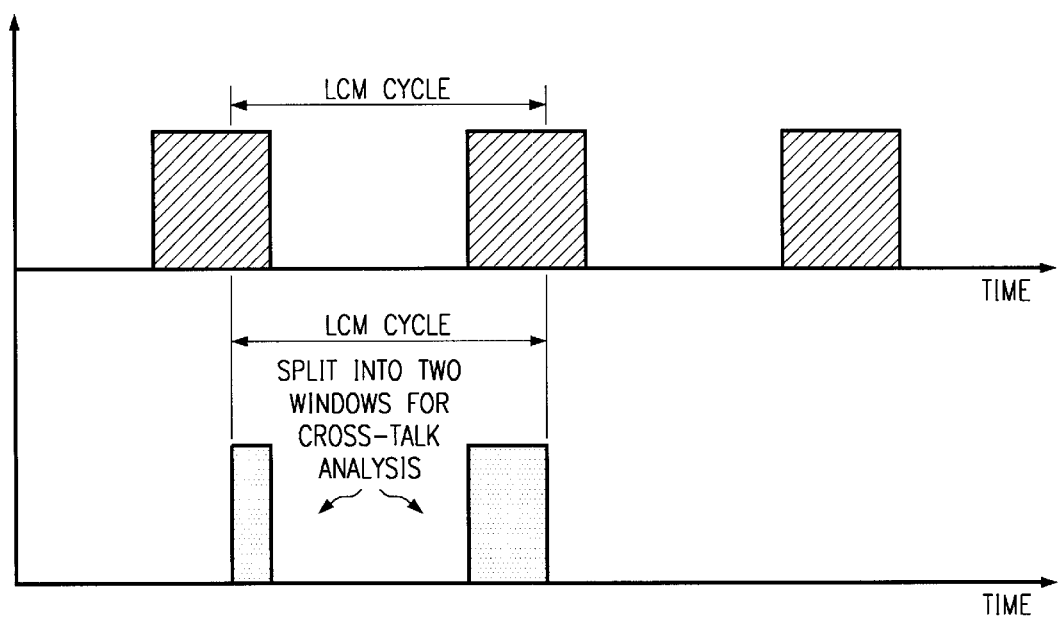
FIG. 6 further illustrates the example in FIG. 5 in accordance with a preferred embodiment of the present invention.

FIG. 6 shows in greater detail the result in FIG. 5 of an aggressor switching window that has been split into two windows because its cyclic pattern overlapped the endpoints of the LCM cycle in accordance with a preferred embodiment of the present invention.

Figure 7:
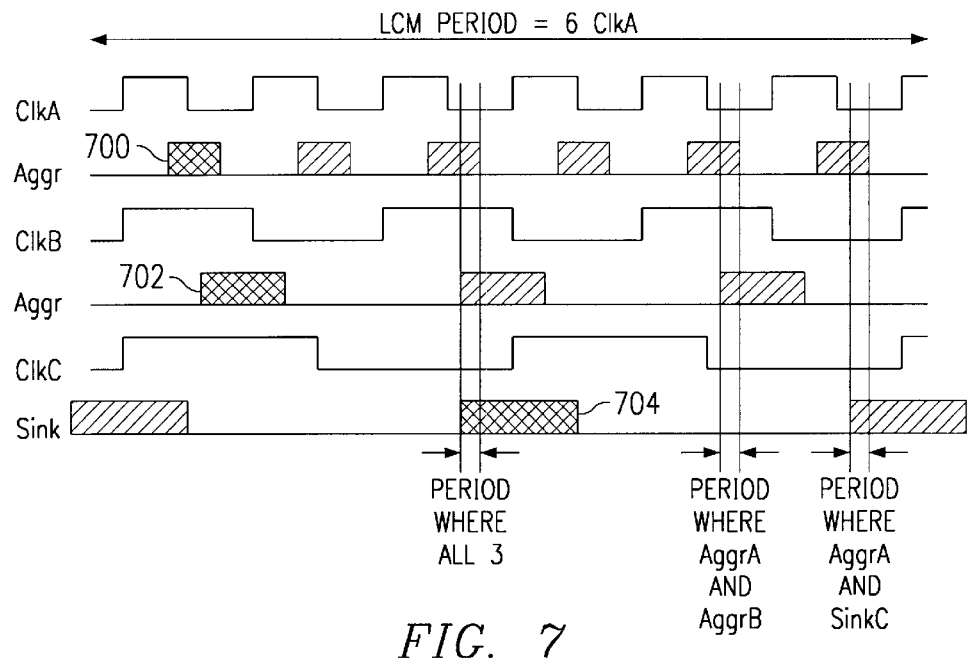
FIG. 7 is an example of two aggressor nets and a victim sink where each is derived from a different clock in accordance with a preferred embodiment of the present invention.

FIG. 7 depicts clock signals for two aggressor nets and a victim sink where each the clock signal for each net is derived from a different clock. Here 3 synchronous clocks are defined and 3 signals are shown, each derived from one of the three clocks in accordance with a preferred embodiment of the present invention. Aggressor A switching window (AggrA) is derived from clock A (ClkA), aggressor B switching window (AggrB) from clock B (ClkB), and sink C sensitivity window (SinkC) from clock C. The period of clock B is twice that of clock A and the period of clock C is three times that of clock A. The LCM period of these three clocks is shown in the figure and is six times the period of clock A, three times the period of clock B, and two times the period of clock C. The various windows are repeated throughout the LCM period as described earlier and as shown in the figure. The first period of any of the three windows is shown in pulses with the denser hash fill (700, 702, 704); the lighter hash fill is the repeating of the various windows throughout the LCM period. Throughout the LCM period, the worst noise case is that indicated in the figure where all three windows overlap. For this situation, both aggressors can switch at a time when the sink window is sensitive to noise.

Figure 9:
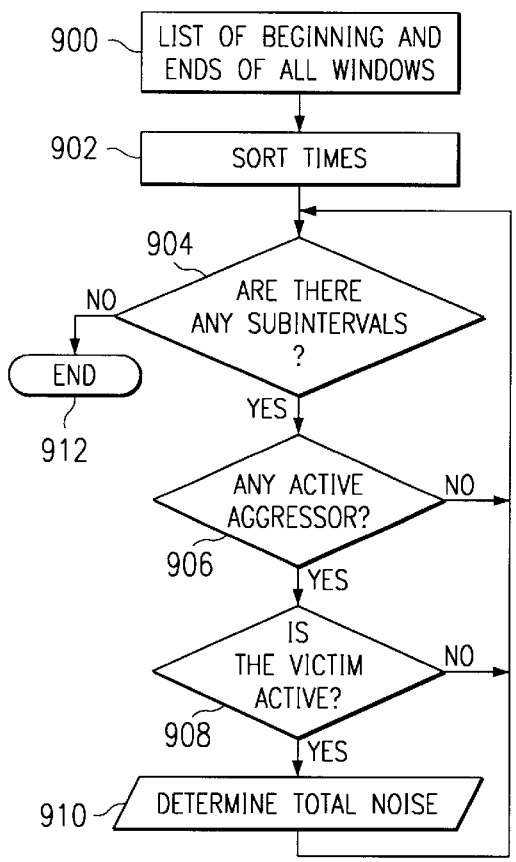
FIG. 9 depicts a process for determining worst noise in a preferred embodiment of the invention.

The actual determination of the aggressor alignment which represents the worst noise is depicted in FIG. 9 and can be done automatically and efficiently with the following process: A list of all beginnings and ends of all aggressor switching windows and victim sensitivity window is formed for those windows occurring totally or partially within the LCM cycle 900. These times are sorted and duplicate times are discarded 902. Sub-intervals are then formed from adjacent times in the sorted list 904. Finally, the aggressors and victim are examined to determine which aggressor switching windows are active during each such sub-interval and also whether the victim sensitivity window is active during the sub-interval 906. Per construction of the sub-intervals, each sub-interval will lie either completely within or completely without any aggressor switching window or victim sensitivity window. If the victim sensitivity window is active, then the active aggressors (those whose aggressor switching windows are active in the sub-interval) and no others are assumed to simultaneously switch in determining the total noise possible during that sub-interval 910. This is done for each such sub-interval, the maximum of all such computed noise being then the total noise possible at the victim sink and the aggressors' involvement in that noise being the pruned set of aggressors contributing to the worst possible noise on that victim sink.

It is possible for a single aggressor to have multiple timing windows, each derived from possibly different clocks. This situation might occur if the signal on a net is a logical combination of the outputs of latches clocked with different clocks. Such aggressors are represented with multiple windows in the above process as if the windows were from independent aggressors, except if two of the multiple windows of a single aggressor overlap, their resulting noise is not combined in determining the total noise as would be done if the two windows were from different aggressors, but rather only one is selected, the one resulting in the most noise.

The above process has so far described how to reduce pessimism when computing noise for the situation where several aggressors induce noise on a victim sink, each having timing windows describing when switching occurs or when sensitive to noise, respectively. The above process is also restricted to a particular choice of clock frequency. If the clock frequency were to change, the temporal alignment of the various timing windows might also change and the noise determined at the original clock frequency might no longer be the worst case noise for the multiple-clock-frequency case. This invention can be extended to insure that the determined noise will be the worst case such noise over a range of clock frequencies.

Figure 8:
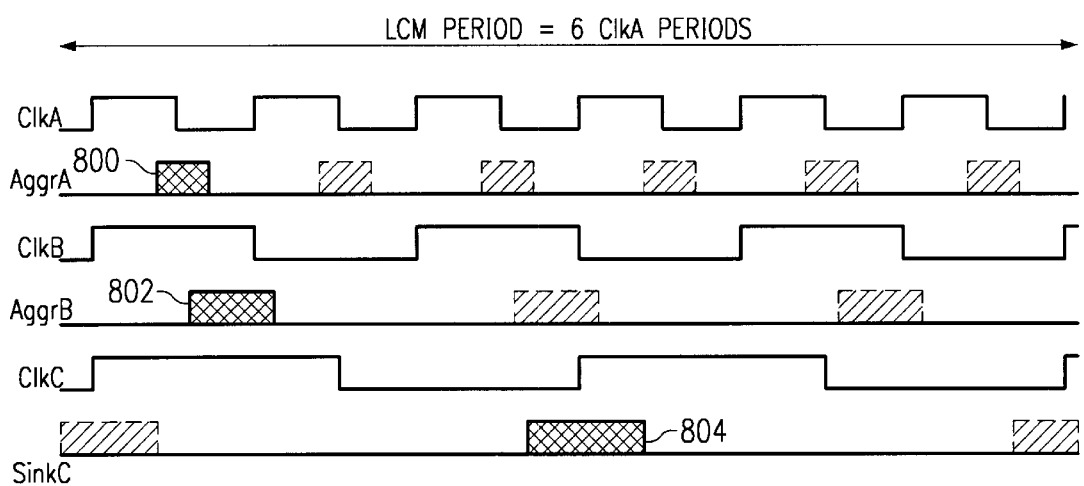
FIG. 8 further illustrates the example in FIG. 7 with the clock frequency being slightly lower in accordance with a preferred embodiment of the present invention.

FIG. 8 shows the situation of FIG. 7 with the clock frequency slightly lower (the clock period is slightly longer). In this example, the overlap of both aggressor windows and the sink window no longer occurs, and the noise would actually be less due to the slower clock frequency. However, it would be possible to also have an increase in noise in the same way.

Figure 10:
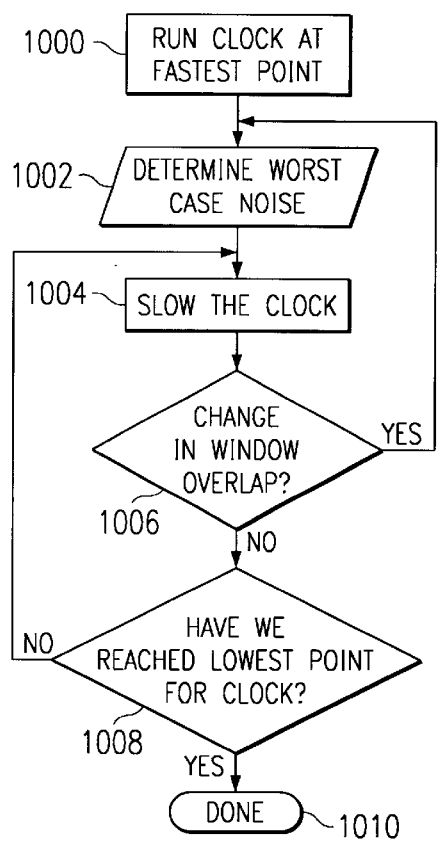
FIG. 10 depicts a process for determining worst noise over a range of frequencies.

The process of determining the worst noise due to window alignment over a range of clock frequencies is depicted in FIG. 10 and would be as follows: first, determine the worst case noise at the fastest clock frequency 1000, 1002; then slow the clock until a change in the window overlap is detected 1004, 1006 (any window pair that once overlapped ceases to overlap or any window pair that previously did not overlap begins to overlap); reanalyze the noise at this new clock frequency in the normal way; repeat the last two steps until all such overlap changes have been processed.

The process of identifying the clock frequencies for which two timing windows overlap begins with expressing all the timing window edges within the LCM window as linear functions of the gcd (greatest common divisor) clock period, $t_{gcd}$. Different nets may not share the same clock period but their respective clock periods are multiples of a common clock period. This common clock period is the gcd. Because every timing window edge is temporally pinned to one and only one gcd clock edge (this is an inevitable and obvious consequence of synchronous logic design), these expressions take on the following form:

$$t_{edge} = (\tfrac{1}{2}*(n)*t_{gcd}) + t_{offset}$$

where n is an integer and is greater than zero and less than twice the number of gcd periods in the LCM window, $t_{offset}$ is equal to the time difference between the timing window edge and the gcd clock edge to which it is temporally pinned. It should also be noted that the minimum and maximum edges of a timing window have the same value of n in the equation above.

The gcd clock period $t_{gcd}$ for which tow timing window edges can align can then be found by equating the two timing window edges. Suppose we have two timing window edges, tedge1 and tedge2, given by the following equations:

$$t_{edge1} = (\tfrac{1}{2}*n_1*t_{gcd}) + t_1$$

and $$t_{edge2} = (\tfrac{1}{2}*n_2*t_{gcd}) + t_2$$

By equating $t_{edge1}$ and $t_{edge2}$, we find $$T_{gcd} = (t_1 - t_2)/(n_2 - n_1).$$

The equation above is only valid when $n_1$ and $n_2$ are not equal. Determining whether two timing windows overlap when $n_1$ equals $n_2$ is a trivial exercise and their relative position does not change with the gcd cycle time. That is, the two windows either always overlap or never overlap regardless of the gcd cycle time.

To find the range of gcd clock periods where two timing windows $t_{window1}$ and $t_{window2}$, can overlap, one equates the minimum value of the first window to the maximum value of the second window, then one would equate the maximum value of the first window to the minimum value of the second window. That is:

$$\max(t_{window1}) = \min(t_{window2})$$

and $$\min(t_{window1}) = \max(t_{window2})$$

Figure 11:
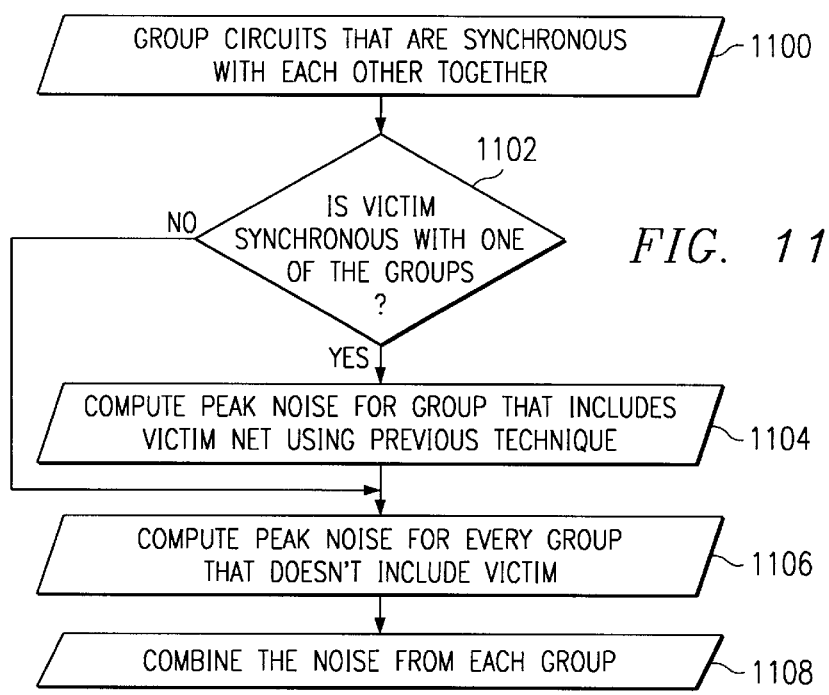
FIG. 11 depicts a process for determining worst noise for groups of synchronous nets that are asynchronous with each other.

Referring to FIG. 11, if any of the nets in the total set of aggressor nets and victim net is asynchronous to another net, the processing proceeds as follows: First, the aggressor nets are grouped into synchronous groups 1100. If the victim net is also synchronous to one of these groups, it is included in that group 1102, and the peak noise for the group is analyzed using the process as described previously 1104. Next, the peak noise of every synchronous group that doesn't include the victim net is computed 1106. This process again involves finding an LCM cycle, but now the peak noise is found as if the victim sensitivity window extended over the entire LCM cycle. Because the noise from these groups is asynchronous to the victim and asynchronous to the other groups, the noise from each such synchronous group is appropriately combined to the synchronously-determined noise (the noise from the aggressors in the sink's synchronous group) without further pruning to find worst case noise that the victim net can sample 1108.

This invention reduces the likelihood of false failures in circuit design analysis by reducing pessimism. This novel approach to reducing pessimism uses timing analyses to determine the point at which noise could appear at the victim sink and cause a failure on the victim net.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A method of analyzing a circuit design, comprising:
   determining a first window for an arrival time for a signal associated with a first circuit;
   determining a second window for an arrival time of a noise signal from a second circuit and affecting the first circuit; and
   determining if the circuit design fails based on detected noise during a period in which the first window coincides with the second window,
   wherein the first circuit and second circuit are synchronous and the step of determining if the circuit design fails further comprises:
   determining a least common multiple cycle by finding a least common multiple of the first window of signal arrival time and the second window of noise signal arrival time.

2. The method of claim 1, wherein the step of determining a first window further comprises determining a beginning point and an endpoint;
   wherein the beginning point of the first window is a latest arrival time that still guarantees correct functional operation of the first circuit; and
   wherein the end point of the first window is an earliest arrival time that still guarantees correct functional operation of the first circuit.

3. The method of claim 2, wherein a beginning point of the first window occurs in a cycle n of a first clock of the first circuit; and
   wherein the end point of the first window occurs in a cycle, n+1, of the first clock of the first circuit.

4. The method of claim 1, wherein there are a plurality of circuits and a plurality of corresponding windows of noise signal arrival time.

5. The method of claim 4, wherein each circuit has a different clock.

6. The method of claim 1, wherein the step of determining a second window comprises:
   determining a beginning point and an end point;
   wherein the beginning point of the second window is determined by adding a delay to an early arrival time of detected noise created by the second circuit and detected at the first circuit; and
   wherein the end point of the second window is determined by adding a delay to a late arrival time of detected noise created by the second circuit and detected at the first circuit.

7. The method of claim 1, wherein a least common multiple cycle is found by finding the least common multiple of the first window of signal arrival times and a plurality of windows of noise signal arrival time.

8. The method of claim 7, wherein each window of noise signal arrival time is associated with a different clock.

9. The method of claim 1, wherein the second circuit has multiple windows of noise signal arrival time.

10. The method of claim 1, wherein a worst case of detected noise may be found over a range of clock frequencies.

11. A method of analyzing a circuit design, comprising:
determining a first window for an arrival time for a signal associated with a first circuit;
determining a second window for an arrival time of a noise signal from a second circuit and affecting the first circuit; and
determining if the circuit design fails based on detected noise during a period in which the first window coincides with the second window,
wherein there are groups of synchronous circuits that are asynchronous with each other and wherein the method of determining if the circuit design fails further comprises:
determining a least common multiple cycle for each group of synchronous circuits;
determining the detected noise within each group of synchronous circuits; and
combining the detected noise from each group.

12. A method for reducing pessimism in cross talk analysis of a victim net comprising the steps of:
identifying an aggressor net that potentially injects noise on a victim sink; determining a victim sensitivity window for the victim net;
determining an aggressor switching window for each aggressor net; and
accounting for peak noise produced by an aggressor net when the victim sensitivity window and aggressor switching window for the aggressor net coincide,
wherein a given set of aggressor nets are synchronous and the step of accounting further comprises:
determining a least common multiple cycle by finding a least common multiple of the aggressor nets and the victim sink;
determining which aggressor switching windows overlap with each other and with the victim sensitivity window within the least common multiple cycle; and
wherein total peak noise is the greater of the highest peak noise of any one aggressor net occurring within the victim sensitivity window and the combination of the peak noise from any aggressor nets whose aggressor switching windows overlap within the victim sensitivity window.

13. The method of claim 12, wherein the step of determining a victim sensitivity window comprises:
determining an early required arrival time;
determining a late required arrival time;
recording a clock signal capture edge of the victim net; and
wherein the beginning of the victim sensitivity window is the early required arrival time and the end of the victim sensitivity window is the late required arrival time.

14. The method of claim 13, wherein the early required arrival time is a victim sink late arrival time plus late mode slack in cycle n; and late required arrival time is a victim sink early arrival time minus early mode slack in cycle n+1.

15. The method of claim 13, wherein late mode slack is a difference between a latest arrival time that still guarantees correct functional operation and an actual late arrival time; and early mode slack is a difference between an actual early arrival time and an earliest arrival time that still guarantees correct functional operation.

16. The method of claim 12, wherein the step of determining an aggressor switching window for each aggressor net comprises:
determining a beginning of the aggressor switching window by adding a noise pulse delay to an early arrival time of an aggressor source; and
determining an ending of the aggressor switching window by adding the noise pulse delay to a late arrival time of the aggressor source.

17. The method of claim 16, wherein the noise pulse delay is a time interval from when the aggressor net switches and when the peak noise develops at the victim sink.

18. The method of claim 12, wherein there are a plurality of aggressor nets with corresponding aggressor switching windows.

19. The method of claim 18, wherein each aggressor net is associated with a different clock.

20. The method of claim 12, wherein peak noise may be found over a range of clock frequencies.

21. A method for reducing pessimism in cross talk analysis of a victim net comprising the steps of:
identifying an aggressor net that potentially injects noise on a victim sink; determining a victim sensitivity window for the victim net;
determining an aggressor switching window for each aggressor net; and
accounting for peak noise produced by an aggressor net when the victim sensitivity window and aggressor switching window for the aggressor net coincide,
wherein there are groups of synchronous nets that are asynchronous with each other and wherein the method of determining it the circuit design fails further comprises:
determining a least common multiple cycle for each group of synchronous circuits;
determining the detected noise within each group of synchronous circuits; and
combining the detected noise from each group.

22. A means for analyzing a circuit design, comprising:
means for determining a first window for an arrival time for a signal associated with a first circuit;
means for determining a second window for an arrival time of a noise signal from a second circuit and affecting the first circuit; and
means for determining if the circuit design fails based on detected noise during a period in which the first window coincides with the second window, wherein the first circuit and second circuit are synchronous and the means for determining if the circuit design fails further comprises:
means for determining a least common multiple cycle by finding a least common multiple of the first window of signal arrival time and the second window of noise signal arrival time.

23. The means of claim 22, wherein the means for determining a first window further comprises a means for determining a beginning point and an endpoint;
wherein the beginning point of the first window is a latest arrival time that still guarantees correct functional operation of the first circuit; and
wherein the end point of the first window is an earliest arrival time that still guarantees correct functional operation of the first circuit.

24. The means of claim 22, wherein there are a plurality of circuits and a plurality of corresponding windows of noise signal arrival time.

25. The means of claim 24, wherein each circuit has a different clock.

26. The means of claim 22, wherein the means for determining a second window comprises:
  means for determining a beginning point and an end point;
  wherein the beginning point of the second window is determined by adding a delay to an early arrival time of detected noise created by the second circuit and detected at the first circuit; and
  wherein the end point of the second window is determined by adding a delay to a late arrival time of detected noise created by the second circuit and detected at the first circuit.

27. The means of claim 22, wherein the second circuit has means for creating multiple windows of noise signal arrival time.

28. A means for analyzing a circuit design, comprising:
  means for determining a first window for an arrival time for a signal associated with a first circuit;
  means for determining a second window for an arrival time of a noise signal from a second circuit and affecting the first circuit; and
  means for determining if the circuit design fails based on detected noise during a period in which the first window coincides with the second window,
  wherein there are groups of synchronous circuits that are asynchronous with each other and wherein the means for determining if the circuit design fails further comprises:
    means for determining a least common multiple cycle for each group of synchronous circuits;
    means for determining the detected noise within each group of synchronous circuits; and
    means for combining the detected noise from each group.

* * * * *